(12) United States Patent
Park et al.

(10) Patent No.: US 12,217,791 B2
(45) Date of Patent: Feb. 4, 2025

(54) NON-VOLATILE MEMORY DEVICE

(71) Applicant: Samsung Electronics Co., Ltd., Suwon-si (KR)

(72) Inventors: Gyuha Park, Suwon-si (KR); Daehan Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 222 days.

(21) Appl. No.: 17/952,826

(22) Filed: Sep. 26, 2022

(65) Prior Publication Data
US 2023/0162783 A1 May 25, 2023

(30) Foreign Application Priority Data

Nov. 22, 2021 (KR) .................. 10-2021-0161492

(51) Int. Cl.
*G11C 11/4093* (2006.01)
*G11C 11/4074* (2006.01)
*G11C 11/408* (2006.01)

(52) U.S. Cl.
CPC ...... *G11C 11/4093* (2013.01); *G11C 11/4074* (2013.01); *G11C 11/4085* (2013.01)

(58) Field of Classification Search
CPC ............................ G11C 11/4093; G11C 11/40
USPC .................................................... 365/189.05
See application file for complete search history.

(56) References Cited

U.S. PATENT DOCUMENTS

| | | | |
|---|---|---|---|
| 7,564,254 B2 | 7/2009 | Chun | |
| 7,907,454 B2 | 3/2011 | Park et al. | |
| 9,036,419 B2 | 5/2015 | Park et al. | |
| 9,064,582 B2 * | 6/2015 | Song | G11C 11/5642 |
| 9,870,833 B2 * | 1/2018 | Lim | G11C 16/3459 |
| 9,953,563 B2 | 4/2018 | Kishi et al. | |
| 10,054,632 B2 | 8/2018 | Seong | |
| 10,431,265 B2 | 10/2019 | Tran et al. | |
| 2010/0074011 A1 * | 3/2010 | Kang | G11C 16/3454 365/185.12 |
| 2020/0349985 A1 * | 11/2020 | Cho | G11C 16/26 |

FOREIGN PATENT DOCUMENTS

| | | |
|---|---|---|
| JP | 6817461 B2 | 1/2021 |
| KR | 100317499 B1 | 1/2002 |
| KR | 10-2007-0002599 A | 1/2007 |

(Continued)

*Primary Examiner* — Muna A Techane

(74) *Attorney, Agent, or Firm* — Harness, Dickey & Pierce, P.L.C.

(57) ABSTRACT

A non-volatile memory device includes: one or more memory blocks including a plurality of memory cells connected to a plurality of word lines, and a plurality of memory cell strings; a page buffer unit; one or more pass units including a plurality of pass transistors that may supply operation voltages to the plurality of word lines; one or more monitoring units including one or more monitoring pass transistors connected to the plurality of pass transistors; a voltage generator that may supply activation voltages to a first pass transistor, in which a leakage current is to be measured, and to the one or more monitoring pass transistors; and a control logic that may control the voltage generator to generate the activation voltages by using a voltage control signal and detect the leakage current based on monitoring voltages output from the one or more monitoring pass transistors.

20 Claims, 11 Drawing Sheets

(56) References Cited

FOREIGN PATENT DOCUMENTS

| KR | 100772547 B1 | 11/2007 |
| KR | 10-2010-0037278 A | 4/2010 |
| KR | 101415744 B1 | 7/2014 |
| KR | 101458955 B1 | 11/2014 |
| KR | 10-2017-0110768 A | 10/2017 |
| KR | 10-2017-0113800 A | 10/2017 |

* cited by examiner

NON-VOLATILE MEMORY DEVICE

CROSS-REFERENCE TO RELATED APPLICATION

This application is based on and claims priority under 35 U.S.C. § 119 to Korean Patent Application No. 10-2021-0161492, filed on Nov. 22, 2021, in the Korean Intellectual Property Office, the disclosure of which is incorporated by reference herein in its entirety.

BACKGROUND

The inventive concepts relate to non-volatile memory devices and, more particularly, to non-volatile memory devices capable of detecting a leakage current of a pass transistor or a buffer transistor through a monitoring unit or a monitoring buffer.

Memory devices may be divided into a volatile memory device and a non-volatile memory device according to whether stored data is lost when power supply is interrupted. The non-volatile memory device includes an electrically erasable and programmable flash memory device.

Memory cells included in a memory cell array of a non-volatile memory device may be connected to a plurality of driving lines. The non-volatile memory device may perform a program operation, a read operation, and an erase operation on the memory cells by applying driving signals to a plurality of driving lines.

In some example embodiments, pass transistors, which supply an operating voltage to the memory cells, or transistor elements in a page buffer, in a non-volatile memory device may change element characteristics such as a threshold voltage due to a leakage current. Such a change in element characteristics may cause malfunction of a non-volatile memory device.

SUMMARY

The inventive concepts provide a non-volatile memory device which may detect a leakage current generated in the non-volatile memory device (e.g., a leakage current that may occur in an element in a non-volatile memory device) and reduce or prevent malfunction caused by a change in element characteristics due to the leakage current, thereby improving performance and reliability of the non-volatile memory device, and thus improving functionality of the non-volatile memory device.

According to some example embodiments of the inventive concepts, a non-volatile memory device may include: one or more memory blocks including a plurality of memory cells connected to a plurality of word lines, and a plurality of memory cell strings arranged in rows and columns; a page buffer unit including a plurality of page buffers connected to the plurality of memory cell strings, respectively; one or more pass units including a plurality of pass transistors that are configured to supply operation voltages to the plurality of word lines; one or more monitoring units including one or more monitoring pass transistors connected to the plurality of pass transistors; a voltage generator that is configured to supply activation voltages to a first pass transistor, in which a leakage current is to be measured, from among the plurality of pass transistors, and to the one or more monitoring pass transistors; and a control logic that is configured to control the voltage generator to generate the activation voltages by using a voltage control signal and to detect the leakage current based on monitoring voltages output from the one or more monitoring pass transistors.

According to some example embodiments of the inventive concepts, a non-volatile memory device may include: one or more memory blocks including a plurality of memory cells connected to a plurality of word lines, and a plurality of memory cell strings arranged in rows and columns; a page buffer unit including a plurality of page buffers that are connected to the plurality of memory cell strings, respectively, and include a plurality of buffer transistors; a monitoring buffer including a plurality of monitoring buffer transistors connected to the plurality of buffer transistors; a voltage generator that is configured to supply activation voltages to a first buffer transistor, in which a leakage current is to be measured, from among the plurality of buffer transistors, and to a first monitoring buffer transistor connected to the first buffer transistor; and a control logic that is configured to control the voltage generator to generate the activation voltages by using a voltage control signal and to detect the leakage current based on a monitoring voltage output from the first monitoring buffer transistor.

According to some example embodiments of the inventive concepts, a non-volatile memory device may include: one or more memory blocks including a plurality of memory cells connected to a plurality of word lines, and a plurality of memory cell strings arranged in rows and columns; a page buffer unit including a plurality of page buffers that are connected to the plurality of memory cell strings, respectively, and include a plurality of buffer transistors; one or more pass units including a plurality of pass transistors that are configured to supply operation voltages to the plurality of word lines; one or more monitoring units including one or more monitoring pass transistors connected to the plurality of pass transistors; a row decoder that is configured to supply activation voltages to at least one of the plurality of pass transistors and the one or more monitoring pass transistors; a monitoring buffer including a plurality of monitoring buffer transistors connected to the plurality of buffer transistors; a voltage generator configured to supply activation voltages to, from among the plurality of pass transistors and the plurality of buffer transistors, a first pass transistor, in which a leakage current is to be measured, and to the one or more monitoring pass transistors, or to a first buffer transistor, in which the leakage current is to be measured, and to a first monitoring buffer transistor connected to the first buffer transistor; and a control logic that is configured to control the voltage generator to generate the activation voltages by using a voltage control signal and to detect the leakage current based on monitoring voltages output from the one or more monitoring pass transistors or the first monitoring buffer transistor.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
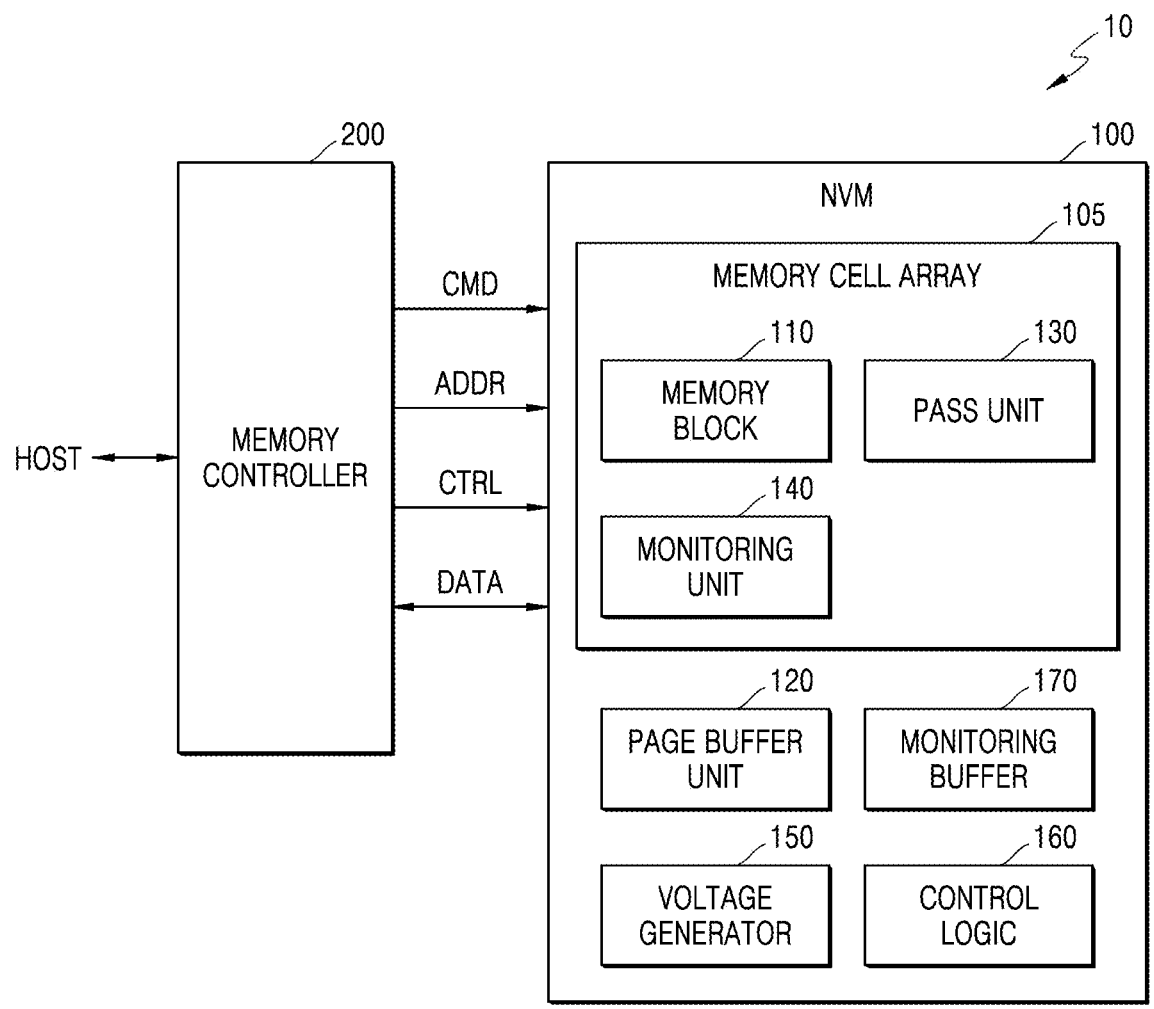
FIG. 1 is a block diagram illustrating a memory system according to some example embodiments of the inventive concepts.

Hereinafter, some example embodiments of the inventive concepts will be described in detail with reference to the accompanying drawings.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

FIG. 1 is a block diagram illustrating a memory system according to some example embodiments of the inventive concepts.

Referring to FIG. 1, a memory system 10 may include a non-volatile memory device (NVM) 100 and a memory controller 200. The non-volatile memory device 100 may include a memory cell array 105, a page buffer unit 120, a voltage generator 150, a control logic 160, and a monitoring buffer 170. The memory cell array 105 may include one or more memory blocks 110 including a plurality of memory cells, one or more pass units 130, and one or more monitoring units 140. The page buffer unit 120 may include a plurality of page buffers.

The memory controller 200 may control the non-volatile memory device 100 to read data stored in the non-volatile memory device 100 or to program data to the non-volatile memory device 100, in response to a read/write request from a host HOST. Specifically, the memory controller 200 may control program, read, and erase operations for the non-volatile memory device 100 by providing a command CMD, an address ADDR, and a control signal CTRL to the non-volatile memory device 100. In addition, data DATA for programming and read data DATA may be transmitted and received between the memory controller 200 and the non-volatile memory device 100.

Figure 2:
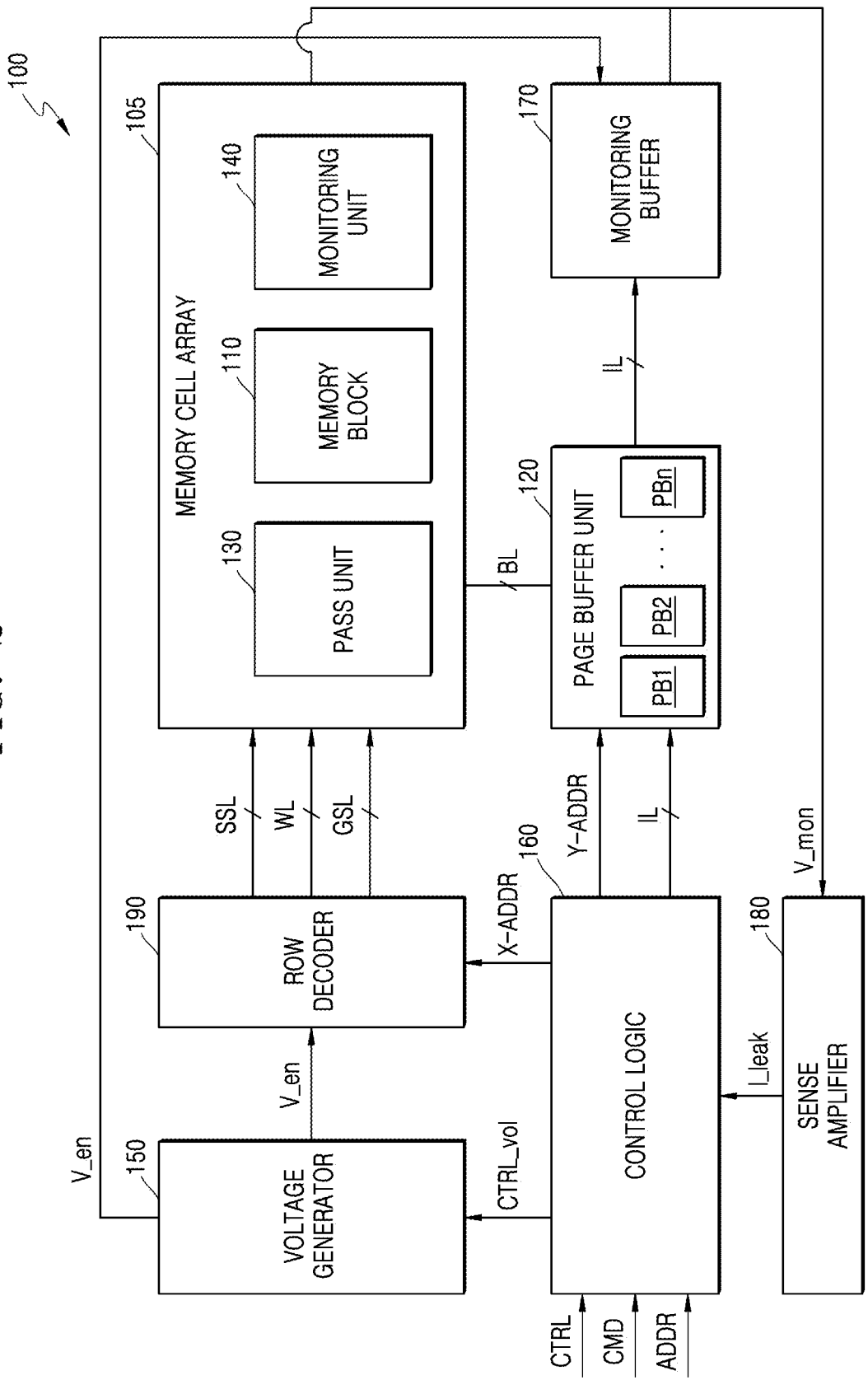
FIG. 2 is a block diagram illustrating a non-volatile memory device of FIG. 1, according to some example embodiments of the inventive concepts.

FIG. 2 is a block diagram illustrating a non-volatile memory device of FIG. 1, according to some example embodiments of the inventive concepts.

Referring to FIG. 2, the non-volatile memory device 100 may include the memory cell array 105 including one or more memory blocks 110, one or more pass units 130, and one or more monitoring units 140, the page buffer unit 120, the voltage generator 150, the control logic 160, the monitoring buffer 170, a sense amplifier 180, and a row decoder 190. Although not shown in FIG. 2, the non-volatile memory device 100 may further include a data input/output circuit or an input/output interface. In addition, the non-volatile memory device 100 may further include a column logic, a voltage generating portion, a pre-decoder, a temperature sensor, a command decoder, an address decoder, and the like.

The memory cell array 105 may be connected to the page buffer unit 120 through a plurality of bit lines BL, and may be connected to the row decoder 190 through a plurality of word lines WL, string selection lines SSL, and ground selection lines GSL.

The memory cell array 105 may include one or more memory blocks 110, and the one or more memory blocks 110 may include a plurality of memory cells connected to a plurality of word lines, and may include a plurality of memory cell strings arranged in rows and columns. In some example embodiments of the inventive concepts, the memory cell may include a flash memory cell. Hereinafter, embodiments of the inventive concepts will be described based on an example in which the memory cell is a NAND flash memory cell. However, the inventive concepts is not limited thereto, and in some embodiments, the memory cell may include a resistive memory cell such as a resistive random access memory (RAM) (ReRAM), a phase change RAM (PRAM), or a magnetic RAM (MRAM).

In some example embodiments of the inventive concepts, the one or more memory blocks 110 may include a memory block having a three-dimensional structure, the memory block having a three-dimensional structure may include a plurality of memory cell strings, and each memory cell string may include memory cells respectively connected to the word lines WL vertically stacked on a substrate, which will be described in detail with reference to FIG. 3.

Figure 3:
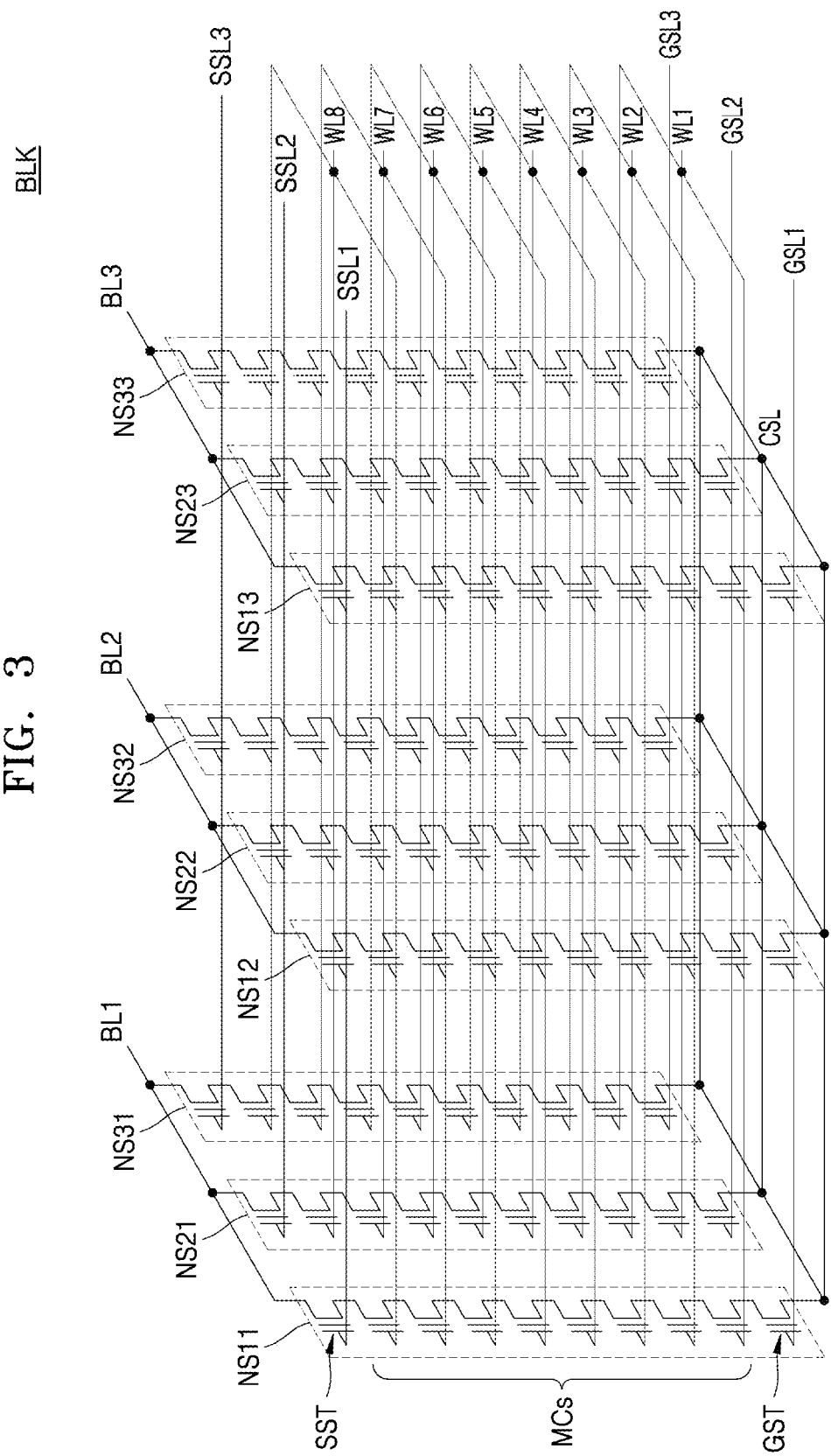
FIG. 3 is a circuit diagram illustrating a memory block according to some example embodiments of the inventive concepts.

FIG. 3 is a circuit diagram illustrating a memory block BLK according to some example embodiments of the inventive concepts.

Referring to FIG. 3, the memory block BLK may include a plurality of memory cell strings NS11 to NS33, a plurality of word lines WL1 to WL8, a plurality of bit lines BL1 to BL3, a plurality of ground selection lines GSL1 to GSL3, and a common source line CSL. The memory block BLK may correspond to one of a plurality of memory blocks BLK1 to BLKz of FIG. 2 (where z may be any positive integer equal to or greater than 2). Here, the number of the plurality of memory cell strings, the number of the plurality of word lines, the number of the plurality of bit lines, the number of the plurality of ground selection lines, and the number of the plurality of string selection lines may be changed in various ways according to some example embodiments.

The plurality of memory cell strings NS11, NS21, and NS31 may be provided between the first bit line BL1 and the common source line CSL, the plurality of memory cell strings NS12, NS22, and NS32 may be provided between the second bit line BL2 and the common source line CSL, and the plurality of memory cell strings NS13, NS23, and NS33 may be provided between the third bit line BL3 and the common source line CSL. Each memory cell string (e.g., NS11) may include a string selection transistor SST, a plurality of memory cells MCs, and a ground selection transistor GST, which are connected in series.

The string selection transistors SST may be connected to the corresponding string selection lines SSL1 to SSL3. The plurality of memory cells MCs may be connected to the corresponding word lines WL1 to WL8, respectively. The ground selection transistors GST may be connected to the corresponding ground selection lines GSL1 to GSL3. The string selection transistors SST may be connected to the corresponding bit lines BL1 to BL3, and the ground selection transistors GST may be connected to the common source line CSL.

Referring back to FIG. 2, the memory cell array 105 may include one or more pass units 130. The one or more pass units 130 may include a plurality of pass transistors that supply operation voltages to the plurality of word lines. In some example embodiments, one or more pass units 130 may be connected to one or more memory blocks 110, respectively, and may supply the operation voltages to the one or more memory blocks 110.

In more detail, the one or more pass units 130 may be connected to the plurality of word lines WL1 to WL8 illustrated in FIG. 3. In some example embodiments, the plurality of pass transistors may be connected to the plurality of word lines WL1 to WL8, respectively, in the one or more pass units 130. In addition, the one or more pass units 130 may supply the operation voltages to the plurality of memory cells MCs through the plurality of word lines WL1 to WL8.

The memory cell array 105 may include the one or more monitoring units 140. The one or more monitoring units 140 may include the one or more monitoring pass transistors connected to the plurality of pass transistors. The one or more monitoring pass transistors may include the same elements as the plurality of pass transistors. In some example embodiments, the one or more monitoring units 140 may be connected to the one or more pass units 130, respectively.

The one or more monitoring pass transistors included in the one or more monitoring units 140 may be connected to the plurality of pass transistors through a power line. In some example embodiments of the inventive concepts, the one or more monitoring pass transistors may be connected to the power line through gate terminals thereof, respectively, and the plurality of pass transistors may be connected to the power line through gate terminals thereof, respectively. That is, the one or more monitoring pass transistors and the plurality of pass transistors may share the power line through the gate terminals thereof, respectively.

The page buffer unit 120 may include a plurality of page buffers PB1 to PBn (n is an integer greater than or equal to 2), and the plurality of page buffers PB1 to PBn may be connected to the plurality of memory cell strings through the plurality of bit lines BL, respectively. The page buffer unit 120 may be connected to the control logic 160 through a plurality of input lines IL, and may include a plurality of buffer transistors connected to the plurality of input lines IL. In addition, the page buffer unit 120 may select some bit lines from among the plurality of bit lines BL in response to a column address Y-ADDR. Specifically, the page buffer unit 120 may operate as a write driver or a sense amplifier according to an operation mode.

The monitoring buffer 170 may be connected to the control logic 160 and the page buffer unit 120 through the plurality of input lines IL, and may include the plurality of monitoring buffer transistors connected to the plurality of input lines IL. Accordingly, the plurality of monitoring buffer transistors may be connected to the plurality of buffer transistors through the plurality of input lines IL. In some example embodiments, the monitoring buffer 170 may include the same number of monitoring buffer transistors as the plurality of buffer transistors included in one page buffer.

Based on the command CMD, the address ADDR, and the control signal CTRL, the control logic 160 may output various control signals for programming data, reading data from the memory cell array 105, or erasing data stored in the memory cell array 105, for example, such as a voltage control signal CTRL_vol, the row address X-ADDR, and the column address Y-ADDR. Accordingly, the control logic 160 may generally control various operations in the non-volatile memory device 100.

In some example embodiments of the inventive concepts, the control logic 160 may supply activation voltages V_en to the plurality of pass transistors and the one or more monitoring pass transistors, and may detect monitoring voltages V_mon of the one or more monitoring pass transistors. In addition, the control logic 160 may detect a leakage current I_leak based on the monitoring voltages V_mon.

In some example embodiments of the inventive concepts, the control logic 160 may supply the activation voltages V_en to the plurality of buffer transistors and the plurality of monitoring buffer transistors, and may detect the monitoring voltages V_mon of the plurality of monitoring buffer transistors. In addition, the control logic 160 may detect the leakage current I_leak based on the monitoring voltages V_mon.

In some example embodiments, the control logic 160 may supply the activation voltages V_en to the plurality of pass transistors, the one or more monitoring pass transistors, the plurality of buffer transistors, and the plurality of monitoring buffer transistors by using the voltage generator 150. In addition, the control logic 160 may detect the leakage current I_leak based on the monitoring voltages V_mon output from the one or more monitoring pass transistors and the plurality of monitoring buffer transistors by using the sense amplifier 180.

The voltage generator 150 may generate the activation voltages V_en, which is the basis for generating an operating voltage for performing program, read, and erase operations on the memory cell array 105, based on the voltage control signal CTRL_vol. In addition, the voltage generator 150 may supply the generated activation voltages V_en to the plurality of pass transistors, the one or more monitoring pass transistors, the plurality of buffer transistors, and the plurality of monitoring buffer transistors.

The voltage generator 150 may include a direct-current (DC) generator for generating a DC voltage and a pulse generator for generating a pulse voltage. The voltage generator 150 may generate various types of activation voltages V_en using the DC voltage generated by the DC generator and the pulse voltage generated by the pulse generator.

The sense amplifier 180 may receive the monitoring voltages V_mon from the monitoring unit 140 and the monitoring buffer 170. In addition, the sense amplifier 180 may output, to the control logic 160, a value of the leakage current I_leak corresponding to the received monitoring voltages V_mon.

The row decoder 190 may select one of one or more memory blocks in response to the row address X-ADDR, and may select one of the plurality of word lines WL of the selected memory block. In addition, the row decoder 190 may supply the activation voltages V_en to the plurality of pass transistors so that the operation voltage is supplied through the selected word line. In addition, the row decoder 190 may supply the activation voltages V_en to the one or more monitoring pass transistors to detect the monitoring voltages V_mon.

Figure 4:
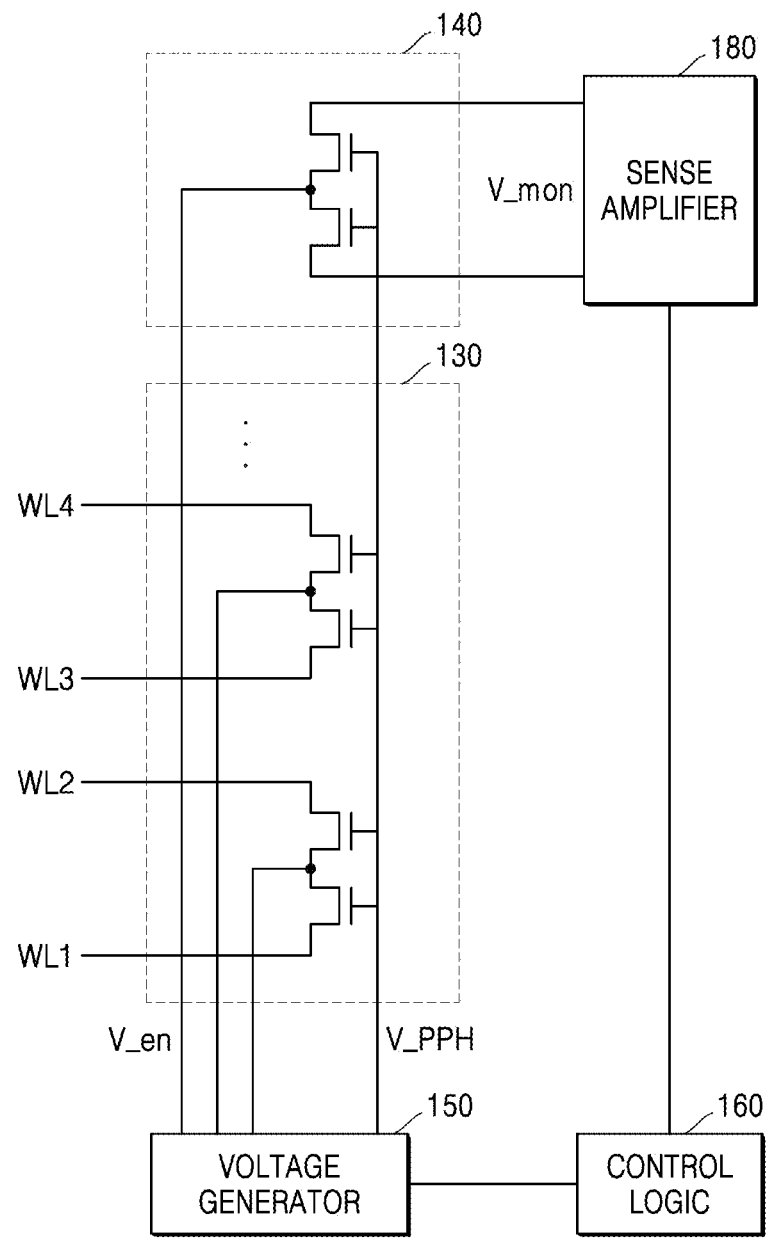
FIG. 4 is a diagram illustrating in more detail a connection between a pass unit, a monitoring unit, and a control logic of a non-volatile memory device according to some example embodiments of the inventive concepts.

FIG. 4 is a diagram illustrating in more detail a connection between a pass unit, a monitoring unit, and a control logic of a non-volatile memory device, according to some example embodiments of the inventive concepts.

Referring to FIG. 4, the pass unit 130 may include the plurality of pass transistors connected to the plurality of word lines. The number of the plurality of pass transistors may be equal to the number of the plurality of word lines.

The plurality of pass transistors may be connected to the word lines through a first end or a second end thereof. In some example embodiments of the inventive concepts, the first end may be a drain end, the second end may be a source end, but the inventive concepts is not limited thereto, and in some example embodiments of the inventive concepts, the first end may be a source end and the second end may be a drain end. However, hereinafter, for convenience of description, some example embodiments in which the first end is the drain end and the second end is the source end will be mainly described.

The plurality of pass transistors may receive the activation voltages V_en from the voltage generator 150 through the end which is not connected to the word line among the first end and the second end. That is, the voltage generator 150 may supply the activation voltages V_en to the plurality of pass transistors through the first or second end of the plurality of pass transistors.

The plurality of pass transistors may receive a power voltage V_PPH from the voltage generator 150 through third ends thereof. That is, the voltage generator 150 may supply the power voltage V_PPH to the plurality of pass transistors through the third ends of the plurality of pass transistors. In some example embodiments of the inventive concepts, the third end may be a gate end.

The monitoring unit 140 may include the one or more monitoring pass transistors connected to the plurality of pass transistors. In some example embodiments of the inventive concepts, the monitoring unit 140 may include two monitoring pass transistors, as shown in FIG. 4. However, the inventive concepts is not limited thereto, and the monitoring unit 140 may further include an additional monitoring pass transistor or may include only one monitoring pass transistor.

The one or more monitoring pass transistors may receive the activation voltages V_en from the voltage generator 150 through a first end or a second end thereof. That is, the voltage generator 150 may supply the activation voltages V_en to the plurality of monitoring pass transistors through the first or second end of each of the plurality of monitoring pass transistors.

The one or more monitoring pass transistors may output the monitoring voltages V_mon through an end at which the activation voltage V_en is not supplied among the first end and the second end thereof. That is, the sense amplifier 180 may receive the monitoring voltages V_mon from the first end or the second end of each of the one or more monitoring pass transistors.

The control logic 160 may supply the activation voltages V_en to the plurality of pass transistors and the one or more monitoring pass transistors through the voltage generator 150. That is, the control logic 160 may control the voltage generator 150 to supply the activation voltages V_en through the first or second end of each of the pass transistors and the one or more monitoring pass transistors.

In some example embodiments of the inventive concepts, the voltage generator 150 may generate the activation voltages V_en based on a signal received from the control logic 160, and supply the activation voltages V_en to the pass transistors and the one or more monitoring pass transistors.

The control logic 160 may sense the monitoring voltages V_mon from the one or more monitoring pass transistors through the sense amplifier 180. That is, the control logic 160 may detect the monitoring voltage V_mon from an end, to which the activation voltage V_en is not supplied, among the first end and the second end of each of the monitoring pass transistors.

The control logic 160 may detect the leakage current I_leak based on the monitoring voltage V_mon, through the sense amplifier 180. In some example embodiments of the inventive concepts, the sense amplifier 180 may detect the leakage current I_leak based on the monitoring voltage V_mon received from each of the one or more monitoring pass transistors, and deliver the value of the leakage current I_leak to the control logic 160.

In some example embodiments of the inventive concepts, when the leakage current I_leak of any one of the plurality of pass transistors is to be sensed, the control logic 160 may supply, through the voltage generator 150, the activation voltage V_en to the pass transistor in which the leakage current I_leak is to be measured. In addition, the control logic 160 may detect, through the sense amplifier 180, the leakage current I_leak based on the monitoring voltages V_mon sensed from the one or more monitoring pass transistors.

In some example embodiments, the method of detecting the leakage current I_leak by the control logic 160 may be described in more detail with reference to FIG. 5.

Figure 5:
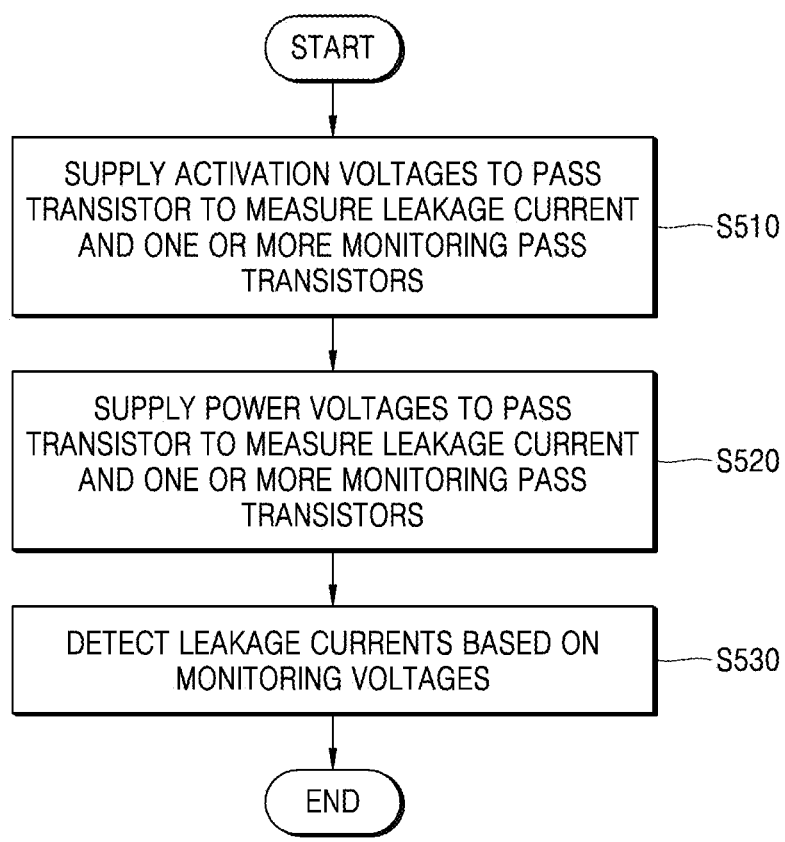
FIG. 5 is a flowchart view illustrating a method, performed by a non-volatile memory device, of detecting a leakage current, according to some example embodiments of the inventive concepts.

FIG. 5 is a flowchart view illustrating a method, performed by a non-volatile memory device, of detecting a leakage current, according to some example embodiments of the inventive concepts.

Referring to FIG. 5, the control logic 160 may supply the activation voltages V_en to the pass transistors, in which the leakage currents I_leak are to be measured, and to the one or more monitoring pass transistor (S510). For example, when the control logic 160 attempts to detect the leakage currents I_leak of a pass transistor connected to the second word line WL2, the control logic 160 may supply the activation voltages V_en to the pass transistors and the one or more monitoring pass transistors which are connected to the second word line WL2. In some example embodiments, the control logic 160 may supply the activation voltages V_en through the voltage generator 150.

The control logic 160 may supply, through the voltage generator 150, the power voltage V_PPH to the pass transistors, in which the leakage currents I_leak are to be measured, and to the one or more monitoring pass transistors (S520). For example, when the control logic 160 attempts to detect the leakage currents I_leak of the pass transistors connected to the second word line WL2, the control logic 160 may supply the power voltages V_PPH to the pass transistors and the one or more monitoring pass transistors which are connected to the second word line WL2.

In addition, the control logic 160 may detect the leakage currents I_leak based on the monitoring voltages V_mon (S530). For example, when the control logic 160 attempts to detect the leakage currents I_leak of the pass transistors connected to the second word line WL2, the control logic 160 may detect the monitoring voltages V_mon from the one or more monitoring pass transistors. In addition, the control logic 160 may detect the leakage currents I_leak based on the sensed monitoring voltages V_mon. The control logic 160 may detect the leakage currents I_leak corresponding to the monitoring voltages V_mon through the sense amplifier 180.

Referring back to FIG. 4, the control logic 160 may detect the leakage currents I_leak in the same manner as described with reference to FIG. 5. The control logic 160 may adjust the power voltage V_PPH supplied to the plurality of pass transistors based on the detected leakage currents I_leak. In some example embodiments, a method of adjusting the power voltage V_PPH by the control logic 160 may be described in more detail with reference to FIG. 6.

Figure 6:
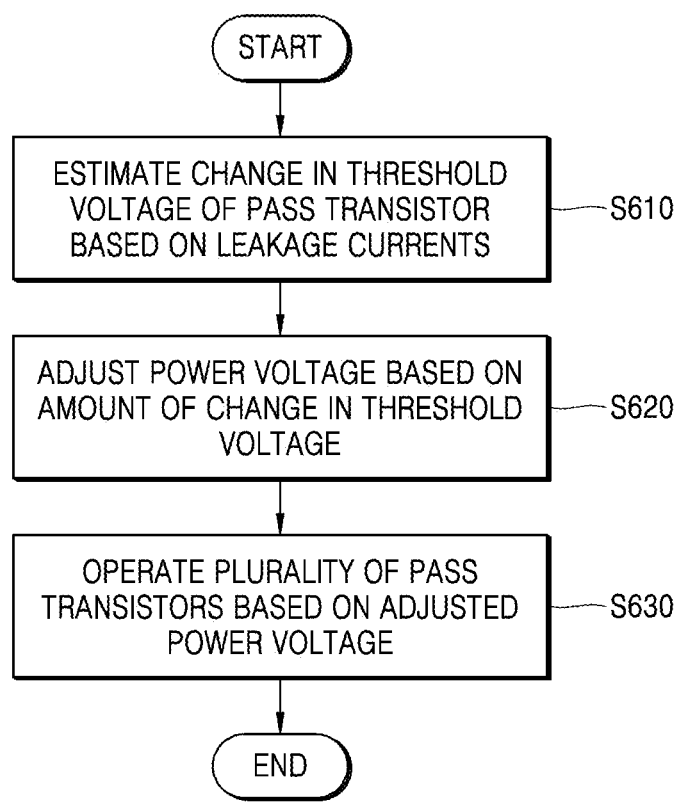
FIG. 6 is a flowchart view illustrating a method of operating a non-volatile memory device based on a detected leakage current, according to some example embodiments of the inventive concepts.

FIG. 6 is a flowchart view illustrating a method of operating a non-volatile memory device based on a detected leakage current according to some example embodiments of the inventive concepts.

Referring to FIG. 6, the control logic 160 may estimate an amount of change in a threshold voltage of each of the pass transistors based on the detected leakage current I_leak (S610). In some example embodiments of the inventive concepts, when the leakage current I_leak is increased, the control logic 160 may determine that a threshold voltage of the pass transistors is increased. In addition, in some example embodiments of the inventive concepts, the control logic 160 may determine that, when the leakage current I_leak is reduced and thus a body voltage of the pass transistor is increased, the threshold voltage of the memory cells MCs is decreased.

The control logic 160 may adjust the power voltage V_PPH based on the amount of change in the threshold voltage (S620). In some example embodiments of the inventive concepts, the control logic 160 may increase the power voltage V_PPH by an increase in the threshold voltage when it is determined that the threshold voltage of the pass transistors is increased. In some example embodiments of the inventive concepts, the control logic 160 may decrease the power voltage V_PPH by a decrease in the threshold voltage when it is determined that the threshold voltage of the pass transistors is decreased.

In some example embodiments, a change in the leakage current I_leak, the threshold voltage, and the power voltage V_PPH may be described in more detail with reference to FIG. 7.

Figure 7:
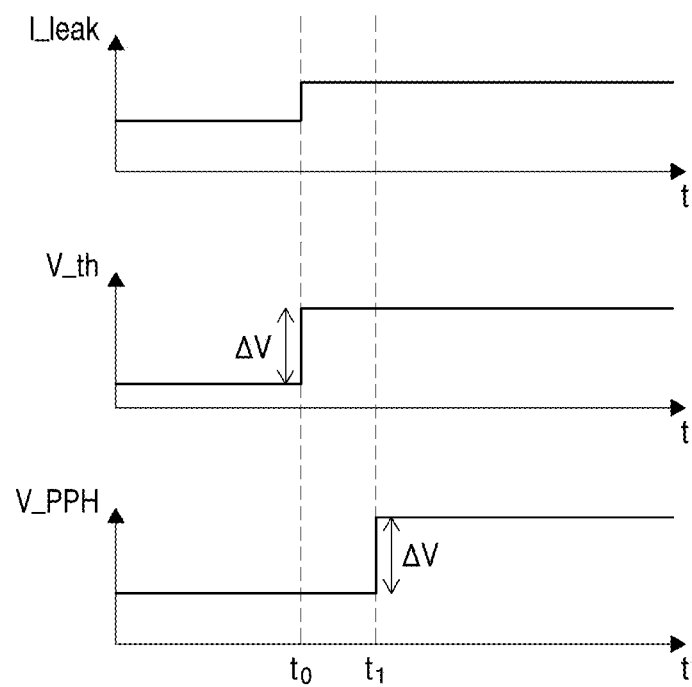
FIG. 7 is a graph illustrating changes in a leakage current, a threshold voltage, and a power voltage in a non-volatile memory device, according to some example embodiments of the inventive concepts.

FIG. 7 is a graph illustrating changes in the leakage current I_leak, the threshold voltage, and the power voltage in a non-volatile memory device, according to some example embodiments of the inventive concepts.

Referring to FIG. 7, the graph illustrating a change, over time, in the leakage current I_leak of a pass transistor, a threshold voltage V_th of the pass transistor, and a power voltage V_PPH of the pass transistor may be identified.

First, it may be confirmed that the leakage current I_leak of the pass transistor increases due to a cause such as an impact from the outside of the non-volatile memory device 100 at time $t_0$. It may be confirmed that as the leakage current I_leak of the pass transistor increases, the threshold voltage V_th of the pass transistor increases by $\Delta V$ at the time $t_0$.

The control logic 160 may detect the leakage currents I_leak through the monitoring voltages V_mon of the one or more monitoring pass transistors. In addition, the control logic 160 may calculate the amount of change in the threshold voltages V_th of the pass transistors based on the detected leakage currents I_leak, and adjust the power voltages V_PPH of the pass transistors according to the calculated amount of change in the threshold voltage V_th. After the operation of the control logic 160 is performed, it may be confirmed that the power voltage V_PPH of the pass transistor increases at time $t_1$.

In some example embodiments, the amount $\Delta V$ of a change in the power voltage V_PPH may be the same value as the amount $\Delta V$ of the change in the threshold voltage V_th.

Referring back to FIG. 6, after adjusting the power voltage V_PPH, the control logic 160 may control the plurality of pass transistors to operate based on the adjusted power voltage V_PPH (S630). In some example embodiments of the inventive concepts, the control logic 160 may supply the adjusted power voltages V_PPH to the plurality of pass transistors in the case of receiving a request to read data stored in the one or more memory blocks 110 or erase the data stored in the one or more memory blocks 110.

Figure 8:
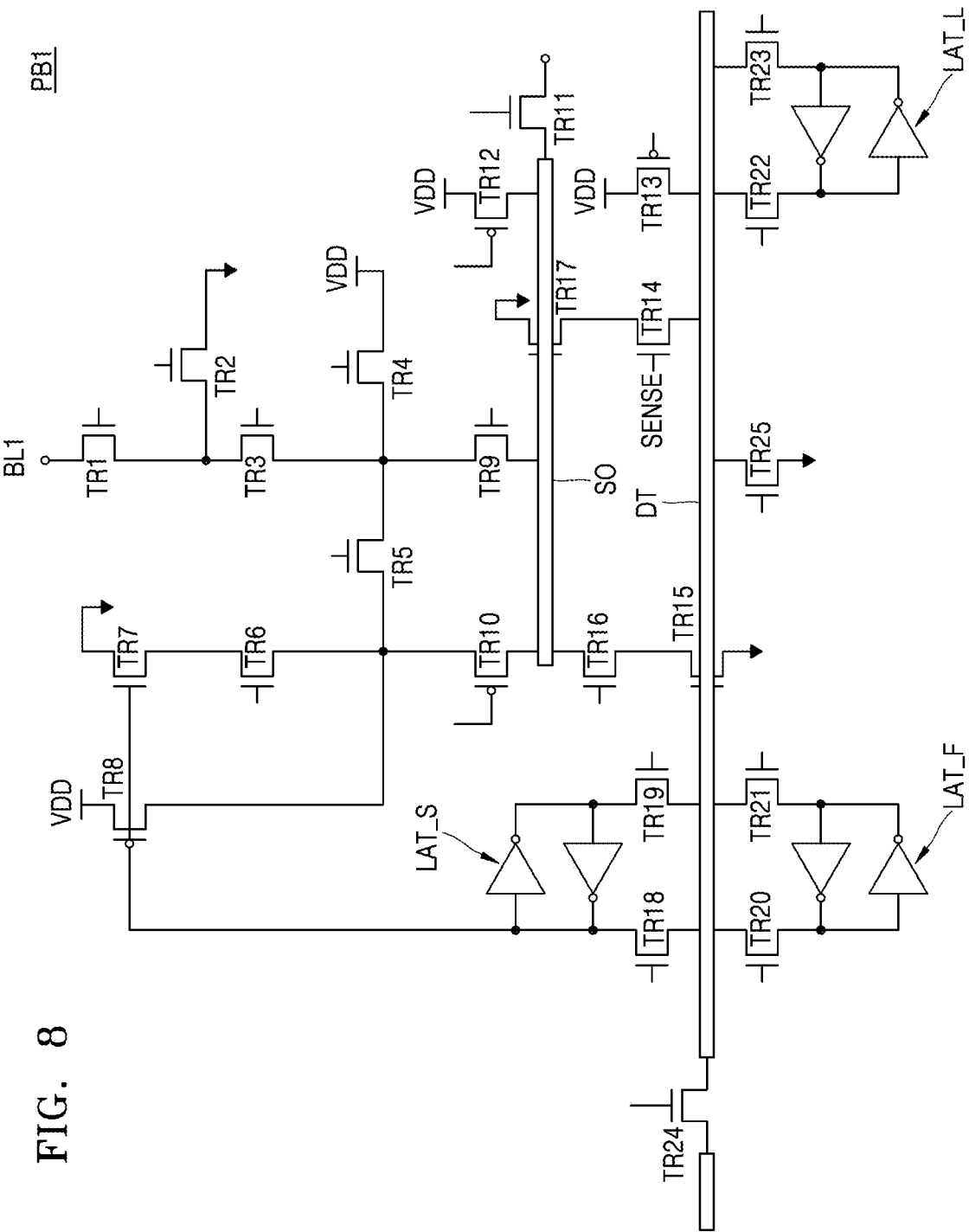
FIG. 8 is a diagram illustrating a page buffer of a non-volatile memory device, according to some example embodiments of the inventive concepts.

FIG. 8 is a diagram illustrating a page buffer of a non-volatile memory device, according to some example embodiments of the inventive concepts.

Referring to FIG. 8, an example of a first page buffer PB1 from among a plurality of page buffers PB1 to PBn included in the page buffer unit 120 is shown. In some example embodiments, the plurality of page buffers PB1 to PBn may include a plurality of buffer transistors connected to a plurality of input lines. All of the plurality of page buffers PB1 to PBn may be configured in the same form.

The first page buffer PB1 may include a plurality of buffer transistors TR1 to TR25 and a plurality of latches LAT_S, LAT_L, and LAT_F. The plurality of buffer transistors TR1 to TR25 may include a connection circuit connecting a sensing node SO and a data transmission node DT with a first bit line BL1, a precharge circuit precharging the sensing node SO or the data transmission node DT, and a circuit for controlling each of the plurality of latches LAT_S, LAT_L, and LAT_F.

In some example embodiments of the inventive concepts, the plurality of latches LAT_S, LAT_L, LAT_F may include a sensing latch LAT_S and a plurality of data latches LAT_L, LAT_F.

In some example embodiments, including the example embodiments illustrated in FIG. 8, the first page buffer PB1 may further include a data transmission node DT in addition to the sensing node SO. The data transfer node DT may be connected to or separated from the data transfer node DT of another page buffer through the 24th buffer transistor TR24. For example, when a counting circuit for counting data stored in the latches LAT_S, LAT_L, and LAT_F of the first page buffer PB1 is connected to the first page buffer PB1 in a wired-OR manner, the 24th buffer transistor TR24 may be turned on. While the 24th buffer transistor TR24 is turned on, data exchange between the latches LAT_S, LAT_L, and LAT_F may not be performed, and the counting circuit may count data stored in the latches LAT_S, LAT_L, and LAT_F in the wired-OR manner by using the data transmission node DT.

Meanwhile, when the latches LAT_S, LAT_L, and LAT_F exchange data through the data transfer node DT, the 24th buffer transistor TR24 may be turned off. Accordingly, while the latches LAT_S, LAT_L, and LAT_F exchange data, the data transmission node DT of the first page buffer PB1 may be separated from the data transmission node DT of another adjacent page buffer.

Meanwhile, in some example embodiments, including the example embodiments illustrated in FIG. 8, each of a plurality of buffer transistors TR1 to TR25 may be connected to at least one conductive line. As described above, the conductive lines may be lines formed on the plurality of buffer transistors TR1 to TR25. For example, one of active regions of the second buffer transistor TR2 and the seventh buffer transistor TR7 may be connected to a conductive line providing a second power voltage, and one of active regions of the twelfth buffer transistor TR12 and the thirteenth buffer transistor TR13 may be connected to a conductive line providing a first power voltage VDD. In addition, one of the active regions of the eleventh buffer transistor TR11 may be connected to a conductive line connecting the first page buffer PB1 to a cache latch.

The first page buffer PB1 may be connected to the first bit line BL1 through a drain end of the first buffer transistor TR1. Accordingly, the first page buffer PB1 may be connected to a memory cell string included in the one or more memory blocks 110. Accordingly, the first page buffer PB1 may read data from the plurality of memory cells MCs included in the memory cell string or may write data to the plurality of memory cells MCs.

The plurality of buffer transistors TR1 to TR25 may be connected to a plurality of input lines. In some example embodiments, the plurality of buffer transistors TR1 to TR25 may be connected to the plurality of input lines through gate ends thereof, respectively. In addition, the plurality of buffer transistors TR1 to TR25 may receive an input voltage through the plurality of input lines, respectively.

In some example embodiments, the plurality of input lines may be shared among the plurality of page buffers PB1 to PBn. For example, an input line connected to the first buffer transistor TR1 of the first page buffer PB1 may be connected to the first buffer transistor TR1 of each of the second to n-th page buffers PB2 to PBn.

Figure 9:
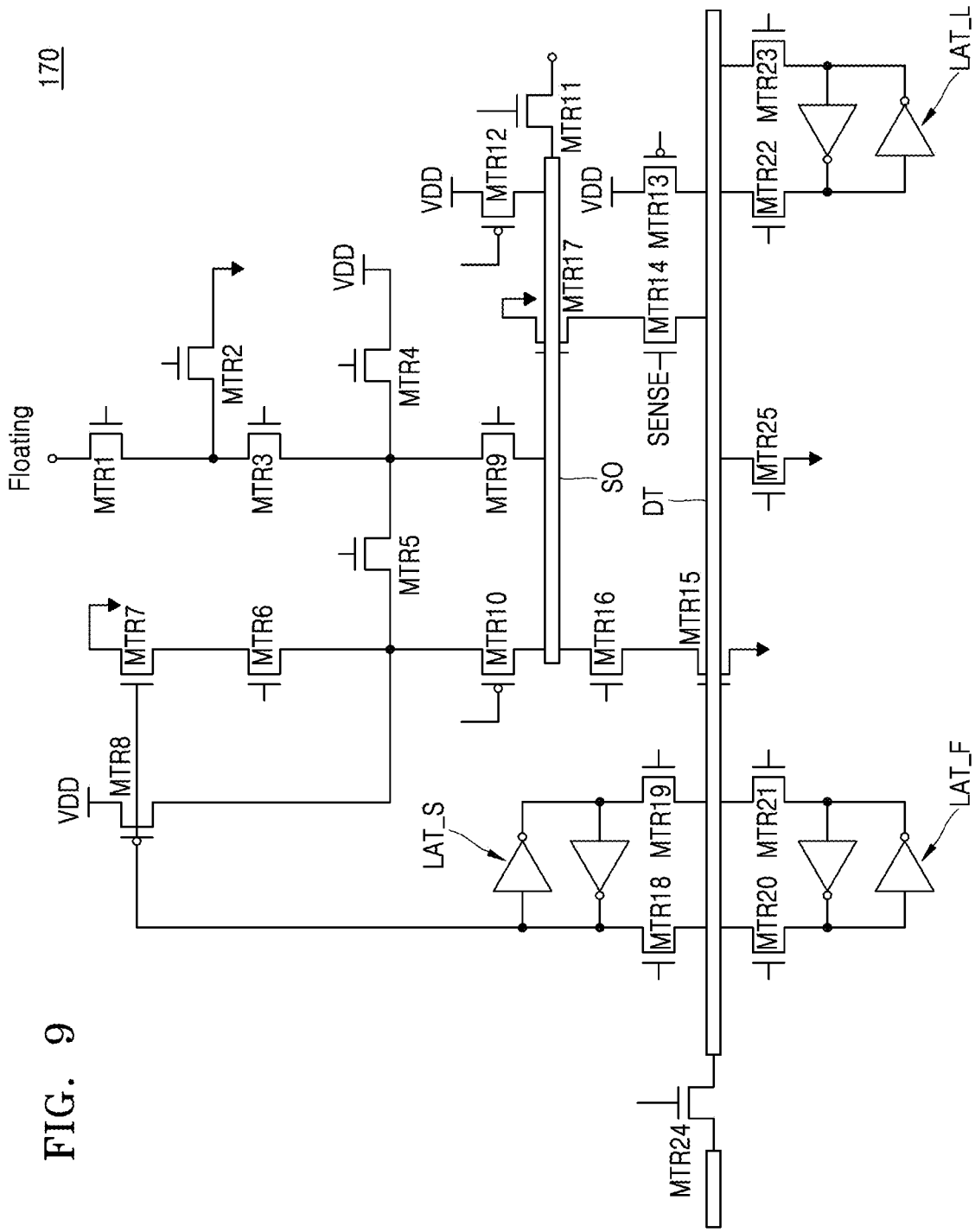
FIG. 9 is a diagram illustrating a monitoring buffer of a non-volatile memory device, according to some example embodiments of the inventive concepts.

FIG. 9 is a diagram illustrating a monitoring buffer of a non-volatile memory device, according to some example embodiments of the inventive concepts.

Referring to FIG. 9, the monitoring buffer 170 according to some example embodiments of the inventive concepts may include a plurality of monitoring buffer transistors MTR1 to MTR25 connected to a plurality of input lines, and a plurality of latches LAT_S, LAT_L, and LAT_F.

The monitoring buffer 170 may share the plurality of input lines with the plurality of page buffers PB1 to PBn. The plurality of monitoring buffer transistors MTR1 to MTR25 may receive an input voltage through the plurality of input lines, respectively.

In some example embodiments, since most operations of the monitoring buffer 170 are the same as those of the first page buffer PB1 described with reference to FIG. 8, differences and features will be mainly described.

A drain end of the first monitoring buffer transistor MTR1 may not be connected to other lines, and may be floated. That is, the monitoring buffer 170 may not be connected to the bit line through the drain end of the first monitoring buffer transistor MTR1. This is because the monitoring buffer 170 does not perform an operation of recording data or reading data, unlike the plurality of page buffers PB1 to PBn.

The plurality of monitoring buffer transistors MTR1 to MTR25 may be connected to the plurality of input lines. In some example embodiments, the plurality of monitoring buffer transistors MTR1 to MTR25 may be connected to the plurality of input lines through third ends thereof, respectively. In addition, the plurality of monitoring buffer transistors MTR1 to MTR25 may receive the input voltage through the plurality of input lines, respectively.

In some example embodiments, the plurality of input lines may be shared with the plurality of page buffers PB1 to PBn. For example, an input line connected to the first monitoring buffer transistor MTR1 of the monitoring buffer 170 may be connected to the first buffer transistor TR1 of the plurality of page buffers PB1 to PBn.

The monitoring buffer 170 may be connected to the control logic 160. The control logic 160 may supply the activation voltage V_en to a monitoring buffer transistor connected to the same input line as a buffer transistor, in which the leakage current I_leak is to be measured, from among the plurality of buffer transistors TR1 to TR25. In addition, the control logic 160 may detect the leakage current I_leak based on the monitoring voltage V_mon of the monitoring buffer transistor to which the activation voltage V_en is supplied.

In some example embodiments, when the leakage current I_leak is to be measured, the control logic 160 may supply the activation voltage V_en to the monitoring buffer transistor connected to the same input line as the buffer transistor, in which the leakage current I_leak is to be measured, and supply the input voltage to the input line, to which the buffer transistor, in which the leakage current I_leak is to be measured, is connected. In addition, when the leakage current I_leak is not measured, the control logic 160 may not supply the activation voltages V_en to the plurality of monitoring buffer transistors MTR1 to MTR25.

A connection between the control logic 160 and the monitoring buffer transistors and a detailed operation of the control logic 160 may be described in more detail with reference to FIG. 10.

Figure 10:
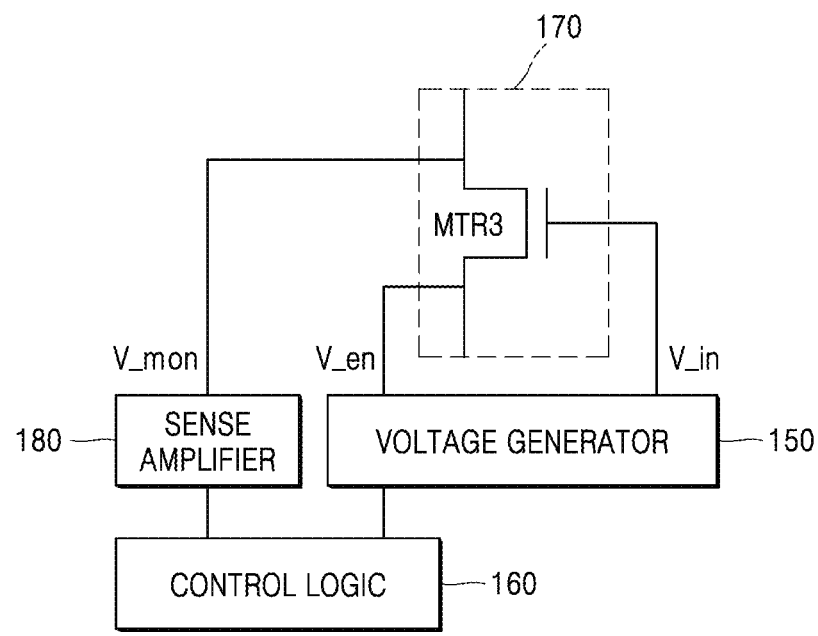
FIG. 10 is a diagram illustrating in more detail a connection between a monitoring buffer transistor and a control logic of a non-volatile memory device, according to some example embodiments of the inventive concepts.

FIG. 10 is a diagram illustrating in more detail a connection between a monitoring buffer transistor and a control logic of a non-volatile memory device according to some example embodiments of the inventive concepts.

Referring to FIG. 10, a connection between the third monitoring buffer transistor MTR3 of the monitoring buffer 170 and the control logic 160 according to some example embodiments of the inventive concepts may be confirmed. FIG. 10 shows a connection between the third monitoring buffer transistor MTR3 and the control logic 160, but a connection between a monitoring buffer transistor other than the third monitoring buffer transistor MTR3 and the control logic 160 may be the same as the connection shown in FIG. 10, and may be controlled by the same method by the control logic 160.

The third monitoring buffer transistor MTR3 may receive the activation voltage V_en from the voltage generator 150 through a first end or a second end thereof. That is, the voltage generator 150 may supply the activation voltage V_en through the first end or the second end of the third monitoring buffer transistor MTR3. In some example embodiments, including the example embodiments illustrated in at least FIG. 10, the voltage generator 150 may supply the activation voltage V_en through the second end of the third monitoring buffer transistor MTR3. In some example embodiments of the inventive concepts, the voltage generator 150 may generate the activation voltage V_en based on a signal received from the control logic 160 and supply the activation voltage V_en to the plurality of monitoring buffer transistors MTR1 to MTR25.

The third monitoring buffer transistor MTR3 may receive the input voltage V_in from the voltage generator 150 through the third end thereof. That is, the voltage generator 150 may supply the input voltage V_in through the third end of the third monitoring buffer transistor MTR3.

The third monitoring buffer transistor MTR3 may output the monitoring voltage V_mon through an end at which the activation voltage V_en is not supplied, among the first end and the second end. That is, the sense amplifier 180 may receive the monitoring voltage V_mon from the first end or the second end of the third monitoring buffer transistor MTR3. In some example embodiments, including the example embodiments illustrated in at least FIG. 10, the sense amplifier 180 may receive the monitoring voltage V_mon from the first end of the third monitoring buffer transistor MTR3.

The control logic 160 may detect the leakage current I_leak based on the monitoring voltage V_mon, through the sense amplifier 180. In some example embodiments of the inventive concepts, the sense amplifier 180 may detect the leakage current I_leak based on the monitoring voltage V_mon received from each of the plurality of monitoring buffer transistors MTR1 to MTR25, and deliver a value of the leakage current I_leak to the control logic 160.

In some example embodiments of the inventive concepts, when detecting the leakage current I_leak of any one of the third buffer transistors TR3 included in the plurality of page buffers PB1 to PBn, the control logic 160 may supply the activation voltage V_en through the second end of the third monitoring buffer transistor MTR3. In addition, the control logic 160 may detect the monitoring voltage V_mon through the first end of the third monitoring buffer transistor MTR3.

In more detail, first, the control logic 160 may supply the activation voltage V_en to the monitoring buffer transistor connected to the same input line as the buffer transistor, in which the leakage current I_leak is to be measured. For example, when the control logic 160 attempts to detect a leakage voltage of any one of the third buffer transistors TR3 included in the plurality of page buffers PB1 to PBn, the control logic 160 may supply the activation voltage V_en to the third monitoring buffer transistor MTR3 connected to the same input line as the third buffer transistor TR3. In some example embodiments, the control logic 160 may supply the activation voltage V_en to the third monitoring buffer transistor MTR3 through the voltage generator 150.

In addition, the control logic 160 may supply the input voltage V_in to an input line to which a buffer transistor, in which the leakage current I_leak is to be measured, is connected. For example, when the control logic 160 attempts to detect the leakage current I_leak of any one of the third buffer transistors TR3 included in the plurality of page buffers PB1 to PBn, the control logic 160 may supply the input voltage V_in to an input line to which the third monitoring buffer transistor MTR3 is connected.

Then, the control logic 160 may detect the leakage current I_leak based on the monitoring voltage V_mon. For example, when the control logic 160 attempts to detect the leakage current I_leak of any one of the third buffer transistors TR3 included in the plurality of page buffers PB1 to PBn, the control logic 160 may detect the monitoring voltage V_mon from the third monitoring buffer transistor MTR3. In addition, the control logic 160 may detect the leakage current I_leak based on the sensed monitoring voltage V_mon. The control logic 160 may detect the leakage current I_leak corresponding to the monitoring voltage V_mon sensed through the sense amplifier 180.

In addition, the control logic 160 may adjust the input voltage V_in based on the detected leakage current I_leak. In some example embodiments, a method of adjusting the input voltage V_in based on the detected leakage current I_leak, by the control logic 160, may be the same as described with reference to FIGS. 7 and 8.

In the non-volatile memory device 100 according to some example embodiments of the inventive concepts as described above, by detecting the leakage current I_leak based on the monitoring voltage V_mon of a monitoring pass transistor or a monitoring buffer transistor MTR, malfunction of the non-volatile memory device 100 due to a change in element characteristics due to the leakage current I_leak may be prevented, or the likelihood of such malfunction may at least be reduced. Accordingly, performance and reliability of the non-volatile memory device 100 may be improved based on preventing or reducing the likelihood of such malfunction thereof, and thus the functionality of the non-volatile memory device may be improved, based on the non-volatile memory device 100 being configured to detect the leakage current I_leak based on the monitoring voltage V_mon of a monitoring pass transistor or a monitoring buffer transistor MTR. In addition, since one or more monitoring pass transistors share a power line with a plurality of pass transistors, an additional decoder is unnecessary for the operation of the one or more monitoring pass transistors. Likewise, since the monitoring buffer transistors MTR1 to MTR25 included in the monitoring buffer 170 share the same input line as the buffer transistors TR1 to TR25 included in the plurality of page buffers PB1 to PBn, additional control logic is unnecessary for the operation of the monitoring buffer transistors MTR1 to MTR25.

Figure 11:
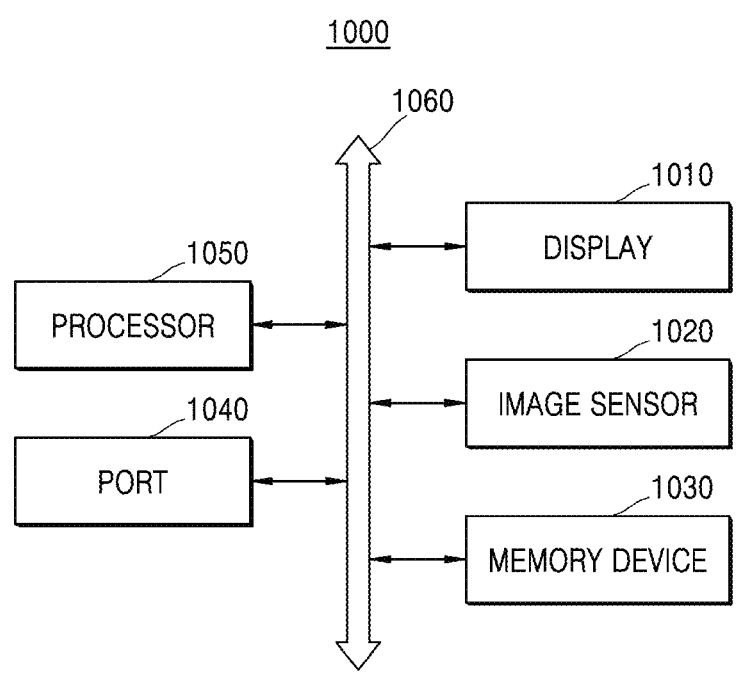
FIG. 11 is a diagram illustrating an electronic device including a non-volatile memory device according to some example embodiments of the inventive concepts.

FIG. 11 is a diagram illustrating an electronic device including a non-volatile memory device according to some example embodiments of the inventive concepts.

Referring to FIG. 11, an electronic device 1000 according to some example embodiments of the inventive concepts may include a display 1010, an image sensor 1020, a memory device 1030, a port 1040, and a processor 1050. Additionally, the electronic device 1000 according to some example embodiments of the inventive concepts may further include a wired/wireless communication device, a power supply device, and the like.

The port 1040 may be a device provided for the electronic device 1000 to communicate with a video card, a sound card, a memory card, a universal serial bus (USB) device, and the like. The electronic device 1000 may include a concept including all of a smartphone, a tablet personal computer (PC), and a smart wearable device in addition to a general desktop computer or a laptop computer.

The processor 1050 may perform a specific operation, an instruction, a task, and the like. The processor 1050 may be a central processing unit (CPU) or a microprocessor unit (MCU), and may communicate with the display 1010, the image sensor 1020, the memory device 1030, as well as other devices connected to the port 1040, via the bus 1060.

The memory device 1030 may include a storage medium for storing data, multimedia data or the like required for an operation of the electronic device 1000. The memory device 1030 may include a concept including a volatile memory such as a random access memory (RAM) or a non-volatile memory such as a flash memory. In addition, the memory device 1030 may include at least one of a solid state drive (SSD), a hard disk drive (HDD), and an optical disk drive (ODD) as a storage device. The memory device 1030 may include any one of the non-volatile memory devices according to any of the example embodiments, including any of the example embodiments described above with reference to FIGS. 1 to 10.

As the electronic device 1000 uses the memory device 1030 according to some example embodiments of the inventive concepts as described above, malfunction due to a change in element characteristics due to the leakage current I_leak generated in the memory device 1030 may be prevented, or the likelihood of such malfunction may at least be reduced. Accordingly, performance and reliability of the memory device 1030 and thus of the electronic device 1000 may be improved based on preventing or reducing the likelihood of such malfunction thereof, and thus the functionality of the memory device 1030 and/or of the electronic device 1000 may be improved, based on the memory device 1030 including any one of the non-volatile memory devices according to any of the example embodiments, including any of the example embodiments described above with reference to FIGS. 1 to 10, and thus being configured to detect a leakage current I_leak based on the monitoring voltage V_mon of a monitoring pass transistor or a monitoring buffer transistor MTR.

Figure 12:
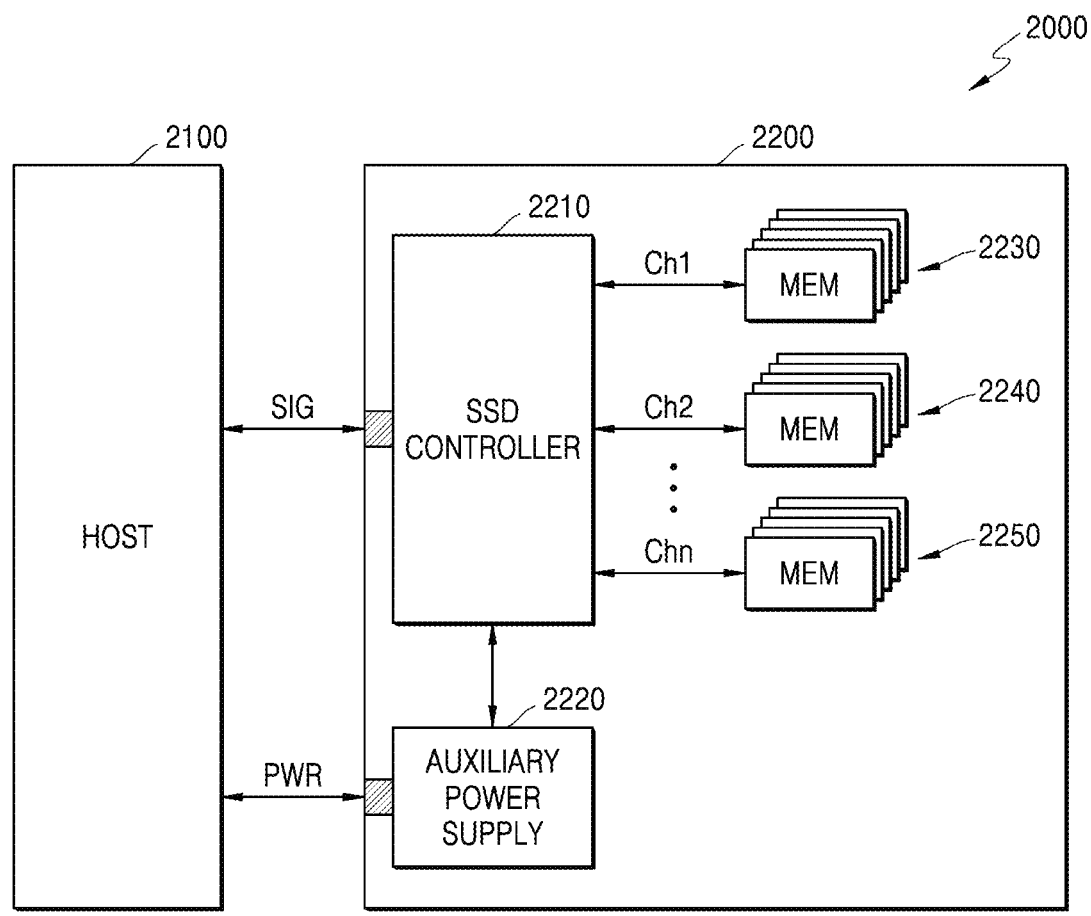
FIG. 12 is a block diagram illustrating an example of a solid state drive (SSD) system having, applied thereto, a non-volatile memory device according to some example embodiments of the inventive concepts.

FIG. 12 is a block diagram illustrating an example of an SSD system having, applied thereto, a non-volatile memory device according to some example embodiments of the inventive concepts.

Referring to FIG. 12, an SSD system 2000 may include a host 2100 and an SSD 2200. The SSD 2200 transmits and receives signals to and from the host 2100 through a signal connector, and receives power through a power connector. The SSD 2200 may include an SSD controller 2210, an auxiliary power supply device 2220, and non-volatile memory devices 2230, 2240, and 2250 communicatively coupled to the SSD controller 210 via respective channels Ch1, Ch2, and Chn. The non-volatile memory devices 2230, 2240, and 2250 may be implemented using some example embodiments described above with reference to FIGS. 1 to 10.

Since the SSD 2200 includes the non-volatile memory devices 2230, 2240, and 2250 according to some example embodiments of the inventive concepts as described above, malfunction due to a change in element characteristics due to the leakage currents I_leak occurring in the elements in the non-volatile memory devices 2230, 2240, and 2250 may be prevented, or the likelihood of such malfunction may at least be reduced, thereby improving reliability of the SSD system 2000 and thus improving the functionality of the SSD system 2000.

As described herein, any devices, systems, parts, blocks, modules, units, controllers, processors, circuits, apparatus, and/or portions thereof according to any of the example embodiments (including, without limitation, any of the example embodiments of the non-volatile memory device 100, the memory cell array 105, the memory block 110, the pass unit 130, the monitoring unit 140, the page buffer unit 120, the voltage generator 150, the control logic 160, the monitoring buffer 170, the sense amplifier 180, the row decoder 190, the memory controller 200, the display 1010, the image sensor 1020, the memory device 1030, the port 1040, the processor 1050, the SSD 2200, the SSD controller 2210, the auxiliary power supply device 2220, the non-volatile memory devices 2230, 2240, 2250, the host 2100, any portion thereof, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, parts, blocks, modules, units, processors, controllers, circuits, apparatuses, and/or portions thereof according to any of some example embodiments, and/or any portions thereof, including for example some or all operations of any of the methods shown in FIGS. 5, 6, 7, or any combination thereof.

While the inventive concepts has been particularly shown and described with reference to some example embodiments thereof, it will be understood that various changes in form and details may be made therein without departing from the spirit and scope of the following claims.

What is claimed is:

1. A non-volatile memory device, comprising:
    one or more memory blocks including
        a plurality of memory cells connected to a plurality of word lines, and
        a plurality of memory cell strings arranged in rows and columns;
    a page buffer unit including a plurality of page buffers connected to the plurality of memory cell strings, respectively;
    one or more pass units including a plurality of pass transistors that are configured to supply operation voltages to the plurality of word lines;
    one or more monitoring units including one or more monitoring pass transistors connected to the plurality of pass transistors;
    a voltage generator that is configured to supply activation voltages to a first pass transistor, in which a leakage current is to be measured, from among the plurality of pass transistors, and to the one or more monitoring pass transistors; and
    a control logic that is configured to
        control the voltage generator to generate the activation voltages by using a voltage control signal, and
        detect the leakage current based on monitoring voltages output from the one or more monitoring pass transistors.

2. The non-volatile memory device of claim 1, wherein
    the voltage generator is configured to supply the activation voltages to the first pass transistor through a first end of the first pass transistor or a second end of the first pass transistor and is configured to supply the activation voltages to the one or more monitoring pass transistors through a first end of each of the one or more monitoring pass transistors or a second end of each of the one or more monitoring pass transistors, and
    the control logic is configured to sense the monitoring voltages from the first end of each of the one or more monitoring pass transistors or the second end of each of the one or more monitoring pass transistors.

3. The non-volatile memory device of claim 1, further comprising a sense amplifier configured to detect the leakage current based on the monitoring voltages and configured to transfer a value of the leakage current to the control logic.

4. The non-volatile memory device of claim 1, further comprising a row decoder which is configured to be controlled by the control logic and is configured to supply the activation voltages to at least one pass transistor of the plurality of pass transistors and the one or more monitoring pass transistors.

5. The non-volatile memory device of claim 4, wherein the control logic is configured to supply the activation voltages to the first pass transistor and the one or more monitoring pass transistors through the row decoder, when the leakage current is to be measured.

6. The non-volatile memory device of claim 1, wherein a third end of each of the plurality of pass transistors is connected to a third end of each of the one or more monitoring pass transistors through a power line.

7. The non-volatile memory device of claim 6, wherein the control logic is configured to adjust a power voltage supplied through the power line, based on the leakage current.

8. The non-volatile memory device of claim 7, wherein the control logic is configured to estimate an amount of a change in a threshold voltage of the first pass transistor due to the leakage current and is configured to adjust the power voltage based on the change in the threshold voltage.

9. A non-volatile memory device, comprising:
    one or more memory blocks including
        a plurality of memory cells connected to a plurality of word lines, and
        a plurality of memory cell strings arranged in rows and columns;
    a page buffer unit including a plurality of page buffers that are connected to the plurality of memory cell strings, respectively, and include a plurality of buffer transistors;

a monitoring buffer including a plurality of monitoring buffer transistors connected to the plurality of buffer transistors;

a voltage generator that is configured to supply activation voltages to a first buffer transistor, in which a leakage current is to be measured, from among the plurality of buffer transistors, and to a first monitoring buffer transistor connected to the first buffer transistor; and a control logic that is configured to
control the voltage generator to generate the activation voltages by using a voltage control signal, and
detect the leakage current based on a monitoring voltage output from the first monitoring buffer transistor.

10. The non-volatile memory device of claim 9, wherein the voltage generator is configured to supply the activation voltages through a first end of each of the first buffer transistor and the first monitoring buffer transistor or a second end of each of the first buffer transistor and the first monitoring buffer transistor, and the control logic is configured to sense the monitoring voltage from the first end of the first monitoring buffer transistor or the second end of the first monitoring buffer transistor.

11. The non-volatile memory device of claim 9, further comprising a sense amplifier configured to detect the leakage current based on the monitoring voltage and configured to transfer a value of the leakage current to the control logic.

12. The non-volatile memory device of claim 9, wherein the control logic is configured to supply an input voltage to each of the plurality of buffer transistors and the plurality of monitoring buffer transistors through a plurality of input lines.

13. The non-volatile memory device of claim 12, wherein the control logic is configured to, when the leakage current is to be measured, supply the activation voltages to the first buffer transistor and the first monitoring buffer transistor, and
supply the input voltage to an input line to which the first buffer transistor is connected.

14. The non-volatile memory device of claim 9, wherein a third end of each of the plurality of buffer transistors is connected to a third end of each of the plurality of monitoring buffer transistors through an input line.

15. The non-volatile memory device of claim 14, wherein the control logic is configured to adjust an input voltage supplied through the input line, based on the leakage current.

16. The non-volatile memory device of claim 15, wherein the control logic is configured to
estimate an amount of a change in a threshold voltage of the first buffer transistor due to the leakage current, and
adjust the input voltage based on the amount of the change in the threshold voltage.

17. A non-volatile memory device, comprising:
one or more memory blocks including a plurality of memory cells connected to a plurality of word lines, and a plurality of memory cell strings arranged in rows and columns;

a page buffer unit including a plurality of page buffers that are connected to the plurality of memory cell strings, respectively, and include a plurality of buffer transistors;

one or more pass units including a plurality of pass transistors that are configured to supply operation voltages to the plurality of word lines;

one or more monitoring units including one or more monitoring pass transistors connected to the plurality of pass transistors;

a row decoder that is configured to supply activation voltages to at least one of the plurality of pass transistors and the one or more monitoring pass transistors;

a monitoring buffer including a plurality of monitoring buffer transistors connected to the plurality of buffer transistors;

a voltage generator configured to supply activation voltages to, from among the plurality of pass transistors and the plurality of buffer transistors,
a first pass transistor, in which a leakage current is to be measured, and to the one or more monitoring pass transistors, or
a first buffer transistor, in which the leakage current is to be measured, and to a first monitoring buffer transistor connected to the first buffer transistor; and a control logic that is configured to control the voltage generator to generate the activation voltages by using a voltage control signal, and
detect the leakage current based on monitoring voltages output from the one or more monitoring pass transistors or the first monitoring buffer transistor.

18. The non-volatile memory device of claim 17, wherein the plurality of memory cell strings are connected to the plurality of page buffers through bit lines.

19. The non-volatile memory device of claim 17, wherein, the non-volatile memory device is configured to, when the leakage current of the first pass transistor is to be measured, cause the voltage generator to supply an activation voltage to each of the first pass transistor and the one or more monitoring pass transistors, and
cause the control logic to detect the leakage current based on the monitoring voltages output from the one or more monitoring pass transistors.

20. The non-volatile memory device of claim 17, wherein, the non-volatile memory device is configured to, when the leakage current of the first buffer transistor is to be measured, cause the voltage generator to supply an activation voltage to each of the first buffer transistor and the first monitoring buffer transistor, and
cause the control logic to detect the leakage current based on the monitoring voltages output from the first monitoring buffer transistor.

* * * * *